(12) United States Patent
Hirai

(10) Patent No.: US 7,816,263 B2
(45) Date of Patent: Oct. 19, 2010

(54) METHOD FOR MANUFACTURING THIN FILM TRANSISTOR

(75) Inventor: Katsura Hirai, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 358 days.

(21) Appl. No.: 11/989,912

(22) PCT Filed: Jul. 18, 2006

(86) PCT No.: PCT/JP2006/314145

§ 371 (c)(1), (2), (4) Date: Jan. 31, 2008

(87) PCT Pub. No.: WO2007/015364

PCT Pub. Date: Feb. 8, 2007

(65) Prior Publication Data

US 2010/0105161 A1    Apr. 29, 2010

(30) Foreign Application Priority Data

Aug. 3, 2005    (JP) ............................. 2005-225288

(51) Int. Cl.
*H01L 21/44* (2006.01)
*H01L 51/40* (2006.01)

(52) U.S. Cl. ...................... 438/674; 438/99; 438/677

(58) Field of Classification Search ................. None
See application file for complete search history.

(56) References Cited

U.S. PATENT DOCUMENTS

| 6,452,207 B1 * | 9/2002 | Bao ............................ 257/40 |
| 2005/0151195 A1 * | 7/2005 | Kawase et al. .............. 257/347 |
| 2007/0004202 A1 * | 1/2007 | Fujii ........................... 438/678 |

FOREIGN PATENT DOCUMENTS

| JP | 2004-158805 | 6/2004 |
| JP | 2004-221573 | 8/2004 |

* cited by examiner

*Primary Examiner*—Scott B Geyer
(74) *Attorney, Agent, or Firm*—Cohen Pontani Lieberman & Pavane LLP

(57) ABSTRACT

Disclosed is a method for manufacturing a thin film transistor having high resolution and high pattern accuracy with high production efficiency. Particularly disclosed is a method for manufacturing a thin film transistor wherein there is prevented deterioration of semiconductor properties in a plating step for electrode formation. This method is characterized in that a source electrode or a drain electrode is formed by such a process wherein a protective film is formed on an organic semiconductor layer, then a plating catalyst pattern is formed thereon by supplying a liquid containing a plating catalyst, and then a plating agent is brought into contact with the pattern.

2 Claims, 6 Drawing Sheets

- 14: ORGANIC THIN FILM TRANSISTOR ELEMENT
- 15: ACCUMULATION CAPACITOR
- 11: GATE BUSLINE
- 10: ORGANIC THIN FILM TRANSISTOR SHEET
- 16: OUTPUT ELEMENT
- 12: SOURCE BUSLINE
- 18: HORIZONTAL DRIVE CIRCUIT
- 17: VIRTICAL DRIVE CIRCUIT

FIG. 4 (1)
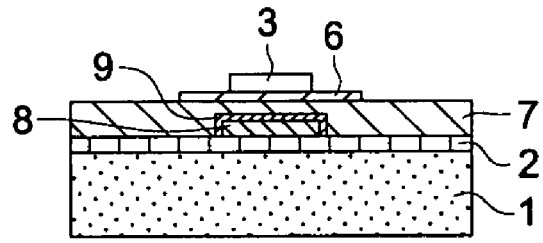
FIG. 4 (2)
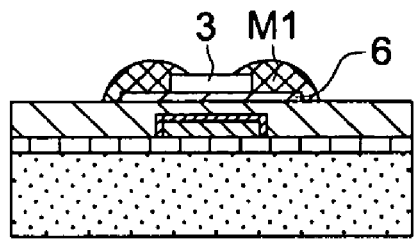
FIG. 4 (3)
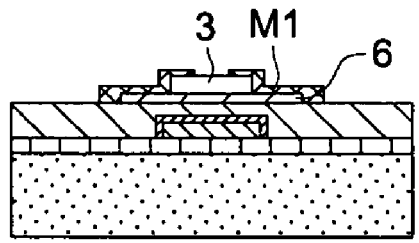
FIG. 4 (4)
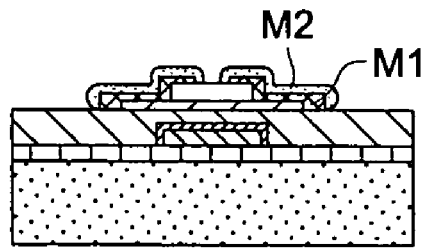

FIG. 5 (1)
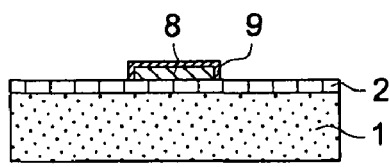
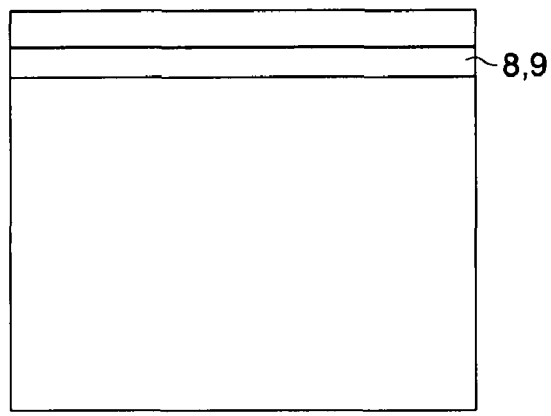
FIG. 5 (2)
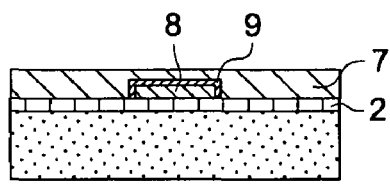
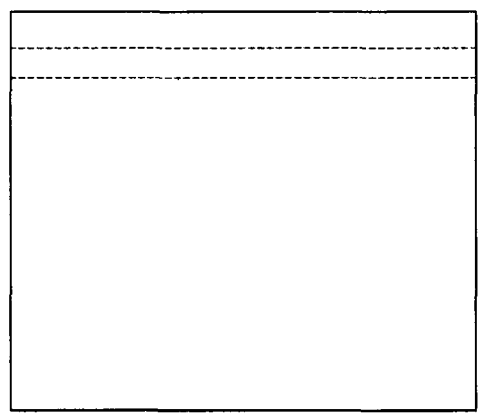
FIG. 5 (3)
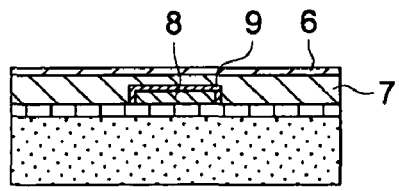
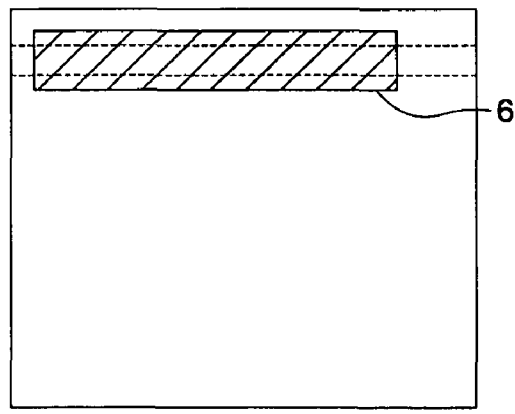

FIG. 6 (1)
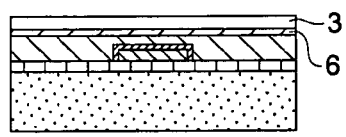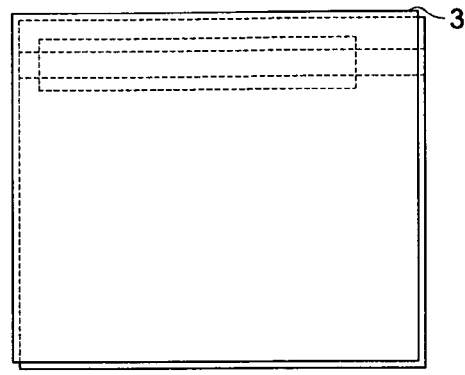
FIG. 6 (2)
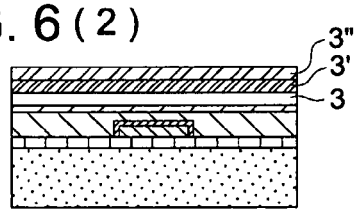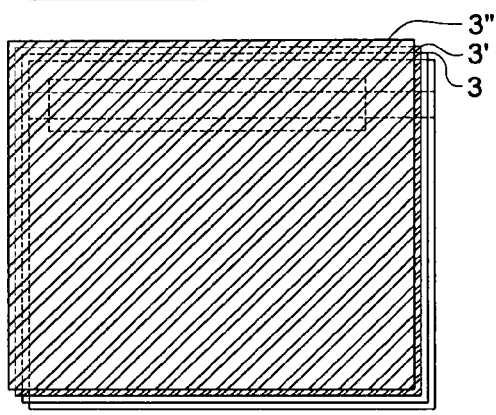
FIG. 7 (1)
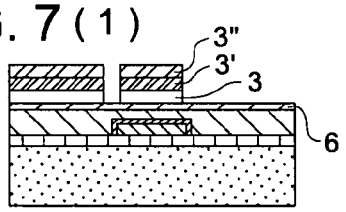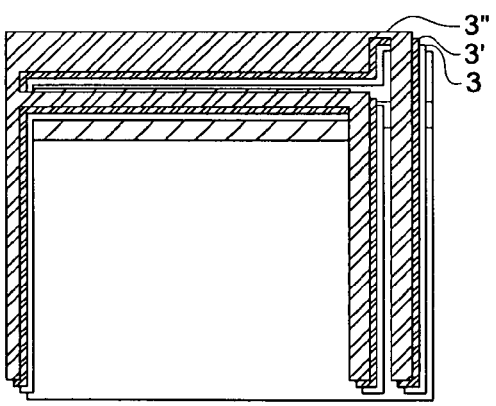
FIG. 7 (2)
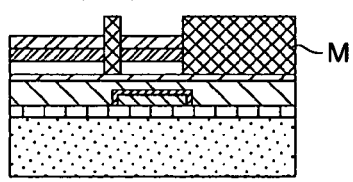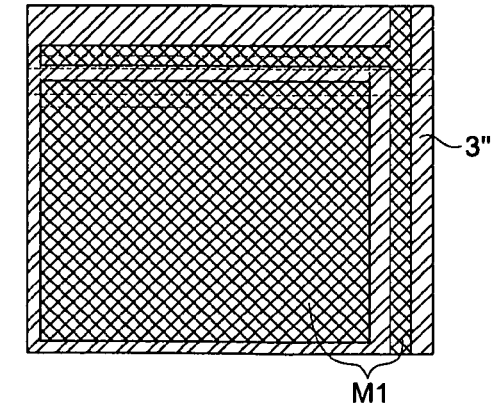
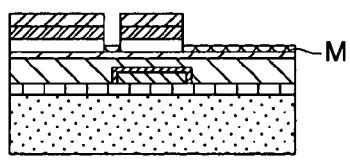

METHOD FOR MANUFACTURING THIN FILM TRANSISTOR

RELATED APPLICATIONS

This is a U.S. National Phase Application under 35 USC 371 of International Application PCT/JP2006/314145 filed on Jul. 18, 2006.

This application claims the priority of Japanese application Ser. No. 2005-225288 filed Aug. 3, 2005 the entire content of which is hereby incorporated by reference.

TECHNICAL FIELD

The present invention relates to a method for manufacturing an organic thin film transistor for use in electronics, photonics, and bioelectronics, and specifically to an effective technology of readily forming a low resistance electrode.

BACKGROUND

Since film formation conditions for devices employing organic semiconductors are milder than those for conventional inorganic semiconductor devices, it is possible to form semiconductor thin films on various substrates and to perform film formation at room temperature, whereby cost reduction, and flexibility of thin films due to the formation thereof on polymer films have been anticipated.

As organic semiconductor materials, conjugated polymers and oligomers such as polyphenylvinylene, polypyrrole, polythiophene, or oligothiophene, as well as polyacene compounds such as anthracene, tetracene, or pentacene have been investigated.

It is reported that specifically, since a polyacene compound exhibits high crystallinity due to its strong intermolecular cohesive force, high carrier mobility and therefore excellent semiconductor device properties are exhibited, which is described, for example, in Shon et al., Science, Vol. 289, p. 559 (2000); Shon et al., Nature, Vol. 403, p. 408 (2000); and Cloke et al., IEEE Transactions on Electron Devices, Vol. 46, p. 1258 (1999).

In contrast, since it is possible to form a thin film by coating a solution of a conjugated polymer such as a polythiophene compound, it has been anticipated to prepare elements at low cost via pattern formation employing a printing method (for example, refer to Sirringhaus et al., Science, Vol. 290, p. 2123 (2000)).

Now, as methods for forming electrodes of the organic semiconductor elements described above, there are proposed a method for forming an electrode pattern via etching or lift-off of a uniformly formed metal thin film (a first method), a method for forming an electrode pattern by printing a paint containing a metal filler (a second method), or a method for forming an electrode pattern by printing a conductive polymer solution (a third method).

However, in the first method, since it is necessary to form a resist layer for pattern formation and to remove the resist layer, there has been a continuing problem in that the pattern formation process was cumbersome. Further, in the second and the third method, a problem has been that resistance of the electrode was increased due to the effect of a binder contained.

Thus, Patent Document 1 describes that a low resistance electrode is readily formed employing electroless plating. This is a method wherein an electrode pattern is readily formed in combinations of a catalyst inducing electroless plating, a plating agent, and patterning therewith, whereby electrode pattern formation becomes possible via no cumbersome steps.

However, when an organic semiconductor layer comes in contact with a plating catalyst liquid or a plating agent, its transistor properties are likely to significantly deteriorate due to changes of the organic semiconductor layer. Further, a common electroless plating method has the problem in that pattern accuracy is too low. The present invention can improve these problems significantly.

Patent Document 1: Japanese Patent Publication Open to Public Inspection (hereinafter, referred to as JP-A) No. 2004-158805

DISCLOSURE OF THE INVENTION

Problems to be Solved by the Invention

Accordingly, an object of the present invention is to provide a method for manufacturing a thin film transistor exhibiting high resolution and high pattern accuracy with high production efficiency, and a method for manufacturing the thin film transistor wherein deterioration of semiconductor properties is prevented in a plating process for the electrode formation.

Means to Solve the Problems

The object of the present invention was achieved employing the following embodiments.

(1) In a method for manufacturing a thin film transistor having an organic semiconductor layer, wherein a source electrode or a drain electrode in contact with the organic semiconductor layer is formed via an electroless plating method, the method for manufacturing the thin film transistor characterized in that a protective layer is formed on the organic semiconductor layer, then a plating catalyst pattern is formed by supplying a plating catalyst-containing liquid, and then a plating agent is brought into contact with the pattern to form the source electrode or the drain electrode.

(2) The method for manufacturing the thin film transistor, described in (1), wherein the plating catalyst pattern is formed by supplying the plating catalyst-containing liquid on a region in contact with the protective layer.

(3) The method for manufacturing the thin film transistor, described in (1) or (2), wherein a region repulsive to the plating catalyst-containing liquid is arranged on the protective layer or on a region contacting the protective layer.

Effects of the Invention

The present invention makes it possible that a high performance organic thin film transistor can readily be formed with no deterioration of an organic semiconductor layer via electrode pattern formation employing electroless plating after arrangement of a protective layer on the organic semiconductor layer.

BRIEF DESCRIPTION OF THE DRAWINGS

FIG. 4 is a view showing a manufacturing example of a TFT sheet employing a method for manufacturing the thin film transistor of the present invention.

FIG. 5 is a view showing a manufacturing example of a TFT sheet employing a method for manufacturing the thin film transistor of the present invention.

FIG. 6 is a view showing a manufacturing example of a TFT sheet employing a method for manufacturing the thin film transistor of the present invention.

FIG. 7 is a view showing a manufacturing example of a TFT sheet employing a method for manufacturing the thin film transistor of the present invention.

Figure 1A:
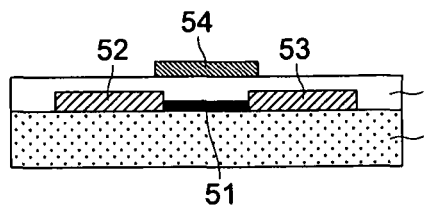
FIG. 1 is a view showing one structural example of the organic thin film transistor element of the present invention.
Figure 1D:
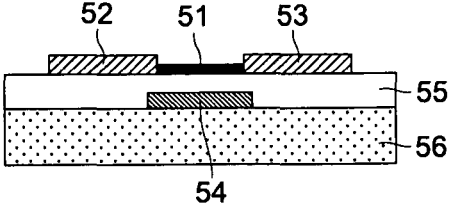
Figure 1B:
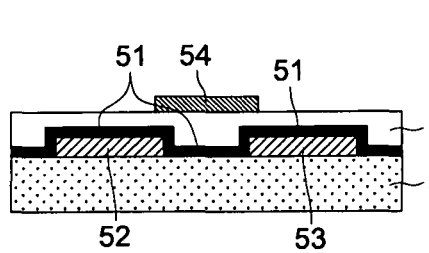
Figure 1E:
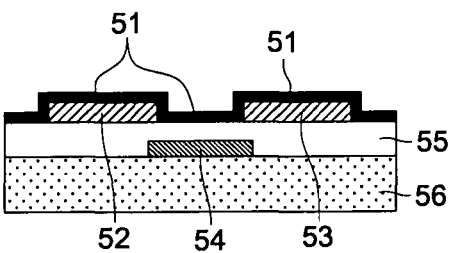
Figure 1C:
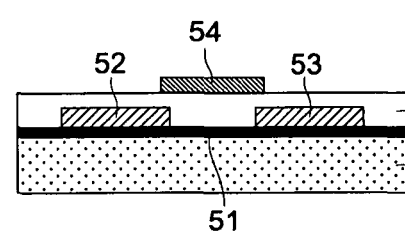
Figure 1F:
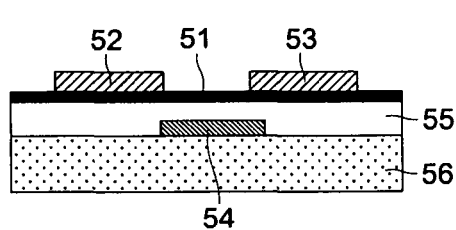

DESCRIPTION OF THE SYMBOLS 1 and 56: substrates
2: sublayer
3: organic semiconductor protective layer
4 and 53: drain electrodes
5 and 52: source electrodes
6 and 51: organic semiconductor layers
7: gate insulation layer
8 and 54: gate electrode
9: anodized film
10: organic thin film transistor sheet
11: gate busline
12: source busline
14: organic thin film transistor element
15: accumulation capacitor
16: output element
17: vertical drive circuit
18: horizontal drive circuit
55: insulation layer

BEST MODE TO CARRY OUT THE INVENTION

The best mode to carry out the present invention will now be described, but the scope of the present invention is not limited thereto.

In a method for manufacturing an organic thin film semiconductor (being an organic semiconductor element), a method employing electroless plating for electrode formation makes it possible to form a low resistance electrode conveniently and at low cost via no complicated steps. However, there has been a problem in that performance of an organic semiconductor tends to be degraded when brought into contact with materials such as a catalyst liquid or a plating agent used to form the electrode.

In a method for manufacturing an organic thin film semiconductor via electrode formation employing an electroless plating method, the present invention can prevent deterioration of the organic semiconductor layer attributed to a plating catalyst or a plating agent, wherein a protective layer is formed on the organic semiconductor layer after forming the organic semiconductor layer to prevent the deterioration of the organic semiconductor layer.

Specifically, since it is unfavorable that the deterioration occurs in the region where a semiconductor channel is formed in the organic semiconductor layer, an electrode is formed after formation of a protective layer pattern. Herewith, the deterioration of the organic semiconductor layer is significantly improved, whereby a high performance organic thin film transistor and a high performance organic semiconductor element can be produced.

The electrode formation method employing an electroless plating method is a method wherein a catalyst, capable of inducing electroless plating by acting on a plating agent, is arranged on a portion where an electrode is arranged, and then the plating agent is brought into contact with the catalyst. Herewith, the catalyst and the plating agent come into contact with each other and the electroless plating is carried out on the portion to form an electrode.

According to the present invention, initially, a plating catalyst pattern is formed, wherein a protective layer is formed on the region of the organic semiconductor layer to be protected against a plating catalyst liquid, and then the plating catalyst-containing liquid is supplied on the protective layer so that no unneeded portion is exposed to the plating catalyst liquid.

The plating catalyst pattern can be formed by patterning the protective layer. The patterning of the protective layer can be conducted via formation of a resist incorporating a photosensitive resin layer or an ablation layer. Utilizing the resist makes high pattern accuracy possible.

The patterning of the protective layer makes possible formation of a pattern of the plating catalyst liquid. The plating catalyst liquid can be applied via a printing method or an ink-jet method, and also immersing in the plating catalyst liquid or coating can be adopted. Further, the electroless plating can be conducted by applying a plating agent. The plating agent can be also applied via a printing method or an ink-jet method, as well as via immersion or coating.

Further, in this case, on the protective layer or on a region contacting the protective layer, a region (being a layer), repulsive to the plating catalyst-containing liquid, is preferably arranged. A specific method is one wherein a layer, repulsive to the plating catalyst liquid and the plating agent, is arranged on the surface of the protective layer.

Herewith, the pattern accuracy can be enhanced and further the deterioration of the semiconductor layer can be decreased.

After patterning the protective layer, a catalyst, inducing electroless plating by acting on the plating agent, is arrange on the portion where an electrode is arranged, then a plating agent may be brought into contact therewith, and alternatively, by applying the plating catalyst and the plating agent reversely, that is, by arranging the plating agent on the portion where the electrode is arranged, then the catalyst, inducing electroless plating by acting on the plating agent, may be brought into contact therewith.

The electrode formation employing electroless plating according to the present invention is preferable, since the electrode formation makes it possible to realize the resistance decrease of an electrode, which has been problematic in employing a conductive filler printing method or a conductive polymer printing method, as well as to prevent the deterioration of the organic semiconductor layer, whereby the semiconductor properties are not adversely affected.

The electroless plating method will now be described.

(Plating Catalysts)

Catalysts inducing electroless plating by acting on the plating agent are composed of at least a compound containing an element selected from Pd, Rh, Pt, Ru, Os, and Ir, and an ion thereof, or a metal fine particle thereof.

Specifically, there are applicable halides such as chlorides, bromides, or fluorides; inorganic salts or complex salts such as sulfates, nitrates, phosphates, borates, or cyanides; a single substance selected from organic complex salts such as carboxylates, organic sulfonates, organic phosphates, alkyl complexes, alkane complexes, alkene complexes, cyclopentadiene complexes, porphyrin, or phthalocyanine, or a mixture thereof; ions of the above elements; and metal fine particles of the above elements. Incidentally, a solution or dispersion containing a surfactant or a resin binder may be added to a catalyst composed of the organic complex salt.

(Plating Agents)

As a plating agent, for example, there is utilized a solution, in which a metallic ion to be deposited as an electrode is homogeneously dissolved, containing a reductant along with a metallic salt. Herein, a solution is commonly used, which does not limit any of those capable of inducing electroless plating, and a gaseous or a powder plating agent may also be used.

Specifically, as the metallic salt, applicable are a halide, nitrate, sulfate, phosphate, borate, acetate, tartrate, and citrate of at least one kind of metal selected from Au, Ag, Cu, Ni, Co, and Fe. Further, as the reductant, applicable are hydrazine, a hydrazine salt, borohalide, hypophoshite, hyposulfite, alcohol, aldehyde, carboxylic acid, and carboxylate. Herein, any element such as boron, phosphor, or nitrogen contained in the reductant may be contained in an electrode to be deposited. Alternatively, an appropriate alloy may be formed using a mixture of these metallic salts.

As the plating agent, a mixture of the metallic salt and the reductant may be applicable, and the metallic salt or the reductant may also be applicable individually. Herein, in order to form an electrode pattern further clearly, a mixture of the metallic salt and the reductant is preferably applied. Further, when the metallic salt or the reductant is applied individually, the metallic salt is initially placed on a portion where the electrode is arranged, and then the reductant is placed, resulting in formation of a more stable electrode pattern.

The plating agent may contain any appropriate additives such as a buffer for pH control or a surfactant, as necessary. Further, any appropriate organic solvent such as an alcohol, ketone, or ester other than water may be added as a solvent used for the solution.

A composition of the plating agent is composed of a composition formed with a metallic salt of a metal to be deposited and a reductant, as appropriate, by adding an additive or an organic solvent, and the concentration and the composition may be adjusted depending on the deposition rate. The deposition rate may also be adjusted by controlling the temperature of the plating agent. Methods to control the temperature include a method for controlling the temperature of the plating agent and a method for controlling the temperature by heating or cooling a substrate prior to immersion in cases of, for example, being immersed in the plating agent. The film thickness of a metal thin film to be deposited may also be adjusted via immersion duration of the plating agent.

The patterning of the catalyst or the plating agent is not specifically limited, but the patterning of the protective layer is preferable.

A method for bringing the plating catalyst (or the plating agent) into contact with a catalyst pattern formed via a resist is not specifically limited, but applicable examples include a method employing immersion in the plating agent (or the catalyst), a method for spraying the plating agent (or the catalyst), a printing method such as an ink-jet method, screen printing, intaglio printing, lithographic printing or letterpress printing. These methods are preferable since the protective layer prevents the catalyst liquid or the plating agent from penetrating the unneeded portions.

Herein, when a solute contained in the plating agent adheres to the surface of the substrate after deposition of the electrode pattern, washing may be applied thereto, as appropriate.

The electrode provided via electroless plating is composed of at least one kind of metal selected from Au, Ag, Cu, Ni, Co, and Fe formed from the above metallic salt, or an alloy thereof. Herein, the metal also includes any appropriate intermetallic compound.

(Protective Layer)

In the present invention, as the protective layer formed on the organic semiconductor layer prior to arrangement of an electrode via the electroless plating, there may be applicable any inert material which has no adverse effect on the organic semiconductor material, and also inhibits the action of the plating catalyst as well as a metallic salt and a reductant contained in the plating agent. When a photosensitive composition such as a photosensitive resin layer is formed on the organic semiconductor protective layer, a material, which is unaffected in the coating process as well as during the patterning of the photosensitive resin layer, is preferable.

As such a material, polymer materials cited below, specifically, materials containing a hydrophilic polymer are exemplified, and further, a solution or an aqueous dispersion of the hydrophilic polymer is preferably included.

The hydrophilic polymer includes polymers featuring solubility or dispersibility to water, or an acid aqueous solution, an alkali aqueous solution, an alcohol aqueous solution, and various surfactant aqueous solutions. For example, polyvinyl alcohol, and a homopolymer or a copolymer composed of a composition such as HEMA, acrylic acid, or acrylamide are preferably utilized. Other materials such as materials containing an inorganic oxide or an inorganic nitride are also preferable due to having no adverse effect on the organic semiconductor as well as in the coating process. Further, any appropriate materials used for a gate insulation layer described below may be utilized.

An organic semiconductor protective layer containing an inorganic oxide or an inorganic nitride, which is a gate insulation layer material, is preferably formed via an atmospheric pressure plasma method.

A method for forming a thin film via a plasma method carried out at atmospheric pressure refers to treatment of forming a thin film on a substrate by plasma-exiting a reactive gas via discharge at or near atmospheric pressure, and the method is described in, for example, JP-A Ser. Nos. 11-61406, 11-133205, 2000-121804, 2000-147209, and 2000-185362 (hereinafter referred to also as an atmospheric pressure plasma method). Herewith, a high performance thin film can be formed with high productivity.

Further, a photoresist is preferably utilized for patterning the protective layer. Any appropriate negative-type or positive-type materials known in the art may be utilized for the photoresist layer, but laser-sensitive materials are preferably utilized. These photoresist materials include (1) light-polymerizable photosensitive materials of a dye-sensitized type as described in JP-A Ser. Nos. 11-271969, 2001-117219, 11-311859, and 11-352691; (2) negative-type photosensitive materials featuring infrared laser sensitivity as described in JP-A Ser. No. 9-179292, U.S. Pat. No. 5,340,699, JP-A Ser. Nos. 10-90885, 2000-321780, and 2001-154374; and (3) positive-type photosensitive materials featuring infrared laser sensitivity as described in JP-A Ser. Nos. 9-171254, 5-115144, 10-87733, 9-43847, 10-268512, 11-194504, 11-223936, 11-84657, 11-174681, 7-285275, and 2000-56452, WO 97/39894 pamphlet, and WO 98/42507 pamphlet. In view of no requirement of a dark room for the process, the materials described in (2) and (3) are preferable, but the materials described in (3), being a positive-type, are most preferable in cases of removing the photoresist layer.

Solvents to form a coating solution of the photosensitive resin include propylene glycol monomethyl ether, propylene glycol monoethyl ether, methyl cellosolve, methyl cellosolve acetate, ethyl cellosolve, ethyl cellosolve acetate, dimethylformamide, dimethyl sulfoxide, dioxane, acetone, cyclohexanone, trichloroethylene, and methyl ethyl ketone. These solvents may be used individually or in combination.

The method for forming the photosensitive resin layer includes methods such as a spray coating method, spin coating method, blade coating method, dip coating method, casting method, roll coating method, bar coating method, die coating method, as described in patterning of the protective layer.

After formation of the photosensitive resin layer, a pattern exposure is carried out using an Ar laser, semiconductor laser, He—Ne laser, YAG laser, or carbon dioxide gas laser. A semiconductor laser featuring an infrared emission wavelength is preferable. The output power thereof is appropriately at least 50 mW, but preferably at least 100 mW.

As a developing solution used to develop the photosensitive resin layer, a water-based alkaline developing solution is preferable. Examples thereof include, for example, aqueous solutions of alkali metallic salts such as sodium hydroxide, potassium hydroxide, sodium carbonate, potassium carbonate, sodium metasilicate, potassium metasilicate, sodium secondary phosphate, or sodium tertiary phosphate; and aqueous solutions prepared by dissolving alkali compounds such as ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-diazabicyclo-[5,4,0]-7-undecane, or 1,5-diazabicyclo-[4,3,0]-5-nonane. The concentration of the alkali compound in the alkaline developing solution of the present invention is commonly from 1-10% by weight, preferably from 2-5% by weight.

An anionic surfactant, an amphoteric surfactant, or an organic solvent such as alcohol may optionally be added in the developing solution. Applicable examples of the organic solvent include propylene glycol, ethylene glycol monophenyl ether, benzyl alcohol, and n-propyl alcohol.

In the present invention, an ablation layer, which is another photosensitive resin layer, may be used to form a plating catalyst pattern of the protective layer, that is, to form an electrode pattern.

The ablation layer of the present invention may be structured of an energy light absorbent, a binder resin, and various additives added thereto, as appropriate.

As the energy light absorbent, various inorganic or organic materials, which absorb energy light irradiated, may be utilized. For example, when an infrared laser is used as the laser light source, there may be utilized a pigment, a dye, metal, a metal oxide, a metal nitride, a metal carbide, a metal boride, graphite, carbon black, titanium black, and ferromagnetic metal powders such as magnetic metal powders containing Al, Fe, Ni, or Co as the main component, all of which absorb infrared rays. Of these, carbon black, a dye such as a cyanine dye, and Fe based ferromagnetic metal powders are preferable. The content of the energy light absorbent is from 30-95% by weight, preferably from 40-80% by weight based on the ablation layer-forming composition.

No binder resin used in the ablation layer is specifically limited provided that the resin adequately carries the colorant fine particles described above. Examples thereof include a polyurethane resin, a polyester resin, a vinyl chloride resin, a polyvinyl acetal resin, a cellulose resin, an acryl resin, a phenoxy resin, a polycarbonate, a polyamide resin, a phenol resin, and an epoxy resin. The content of the binder resin is from 5-70% by weight, preferably from 20-60% by weight, based on the ablation layer-forming composition.

The ablation layer according to the present specification refers to a layer ablated by irradiating high-density energy light, and "ablation" herein means those phenomena in that via a physical or chemical change, the ablation layer is completely scattered, or partly destroyed or scattered, and some certain physical or chemical changes occur only at the vicinity of the interface between the ablation layer and its adjacent layer. An electrode is formed via formation of a resist image employing the ablation.

The high-density energy light is not specifically limited provided that the light is actinic light initiating the ablation. An exposure method may include a method of flash exposure through a photomask using a xenon lamp, a halogen lamp, or a mercury lamp, or a method of scanning exposure via convergence of laser rays. An infrared laser featuring an output power of 20-200 mW per laser beam, specifically a semiconductor laser, is most preferably utilized. The energy density is preferably from 50-500 $mJ/cm^2$, more preferably from 100-300 $mJ/cm^2$.

Further, an electrode material repulsion layer of an about 0.5 μm thickness is preferably formed on the photosensitive resin layer (namely the ablation layer) via solvent coating.

The electrode material repulsion layer refers to a silicone rubber layer or a layer which provides the surface of the photosensitive layer with repulsive properties against an electrode material, that is, the plating catalyst liquid or the plating agent liquid according to the present invention. Patterning is carried out via combination with the photosensitive layer, wherein the electrode material repulsion layer is coated on the photosensitive layer and then the coated photosensitive layer is exposed or developed. For the photosensitive layer, an ablation layer or a light-polymerizable photosensitive material is preferably employed.

For example, a pattern of a source electrode and a source busline is exposed using a semiconductor laser on the photosensitive layer and the electrode material repulsion layer thus formed, followed by removing the electrode material repulsion layer (being the silicone rubber layer), having been exposed, via brushing treatment. Since adhesion between the photosensitive layer and the silicone rubber layer is changed, the silicone rubber layer can readily be removed via the brushing treatment.

Subsequently, by well washing with water, the exposed photosensitive layer and also the exposed protective layer composed of, for example, polyvinyl alcohol are dissolved and then removed, whereby an organic semiconductor thin layer, where the protective layer had been removed, is exposed in the region to be treated via electroless plating.

Via combination of the electrode material repulsion layer and the electroless plating materials, the effect of the protective layer can be enhanced, whereby precise patterning can be carried out only for the portion where the electrode is formed and also the patterning of the electrode material can be conducted via a simple process.

After the formation of the electrode, the resist image may be removed. To remove the resist image, an appropriate solvent used is selected from a wide range of organic solvents used as a coating solvent for a photoresist such as an alcohol, an ether, an ester, a ketone, or a glycol ether solvent. Of these, a preferable solvent is one that tends not to corrode the organic semiconductor layer.

(Organic Semiconductor Layer)

Various condensed polycyclic aromatic compounds or conjugated compounds are applicable to materials constituting the organic semiconductor layer.

Examples of the condensed polycyclic aromatic compounds include a compound such as anthracene, tetracene, pentacene, hexacene, heptacene, chrysene, pysene, fuluminene, pyrene, peropyrene, perylene, terylene, quoterylene, coronene, ovalene, circumanthracene, bisanthene, sesulene, heptasesulene, pyranthrene, violanthene, isoviolanthene, circobiphenyl, phthalocyanine, and porphyrin, as well as derivatives thereof.

Examples of the conjugated compounds include polythiophene and oligomers thereof, polypyrrole and oligomers thereof, polyaniline, polyphenylene and oligomers thereof, polyphenylene vinylene and oligomers thereof, polythienylene vinylene and oligomers thereof, polyacetylene, polydiacetylene, tetrathiafluvalene compounds, quinone compounds, cyano compounds such as tetracyanoquinodimethane, and fullerene as well as derivatives and mixtures thereof.

Further, specifically, of polythiophene and oligomers thereof, there may preferably be utilized oligomers featuring a thiophene hexamer structure such as α-sexithiophene, α,ω-dihexyl-α-sexithiophene, α,ω-dihexyl-α-quinquethiophene, or α,ω-bis(3-butoxypropyl)-α-sexithiophene.

Further, there are cited metal phthalocyanines such as copper phthalocyanine, or fluorine-substituted copper phthalocyanine described in JP-A Ser. No. 11-251601; condensed ring tetracarboxylic acid dimides including naphthalenetetracarboxylic acid dimides such as naphthalene-1,4,5,8-tertacarboxylic acid diimide, N,N'-bis(4-trifluoromethylbenzyl) naphthalene-1,4,5,8-tetracarboxylic acid diimide, as well as N,N'-bis(1H,1H-perfluorooctyl), N,N'-bis(1H,1H-perfluorobutyl), and N,N'-dioctylnaphthalene-1,4,5,8-tetracarboxylic acid diimide derivatives, or naphthalene-2,3,6,7-tetracarboxylic acid diimide, and anthracenetetracarboxylic acid diimides such as anthracene-2,3,6,7-tetracarboxylic acid diimide; fullerenes such as $C_{60}$, $C_{70}$, $C_{76}$, $C_{78}$, or $C_{84}$; carbon nanotubes such as SWNT; and dyes such as merocyanine dyes or hemicyanine dyes.

Of these π-conjugated materials, preferable is at least one type selected from the group including condensed polycyclic aromatic compounds such as pentacene, fullerenes, condensed ring tetracarboxylic acid diimides, and metal phthalocyanines.

Further, as the organic semiconductor material of the present invention, preferable also are silylethynylpentacene compounds described in Adv. Mater., 2003, 15, No. 23, Dec. 3 (2009-2011) and compounds having acene or heteroacene as the mother nucleus described in J. Am. Chem. Soc., 2005, 127, 4986-4987, and there may be preferably utilized silylethynylpentacene, trisalkylsilylethynylpentacene, and triisopropylsilylethynylpentacene.

Still further, other organic semiconductor materials used may also include organic molecular complexes such as tetrathiafluvalene (TTF)-tetracyanoquinodimethane (TCNQ) complexes, bisethylenetetrathiafluvalene (BEDTTTF)-perchloric acid complexes, BEDTTTF-iodine complexes, or TCNQ-iodine complexes. Additionally, there may be utilized σ-conjugated polymers such as polysilane or polygerman, and organic-inorganic composite materials described in JP-A Ser. No. 2000-260999.

Further, of the above polythiophenes and oligomers thereof, thiophene oligomers represented by following Formula (1) are preferable.

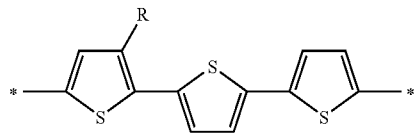

Formula (1)

wherein R represents a substituent.

(Thiophene Oligomers Represented by Formula (1))

The thiophene oligomers represented by Formula (1) will now be described.

Examples of the substituent represented by R in Formula (1) include, for example, an alkyl group such as a methyl group, an ethyl group, a propyl group, an isopropyl group, a tert-butyl group, a pentyl group, a hexyl group, an octyl group, a dodecyl group, a tridecyl group, a tetradecyl group, or a pentadecyl group; a cycloalkyl group such as a cyclopentyl group or a cyclohexyl group; an alkenyl group such as a vinyl group or an allyl group; an alkynyl group such as an ethynyl group or a propargyl group; an aryl group such as a phenyl group, a p-chlorophenyl group, a mesityl group, a tolyl group, a xylyl group, a naphthyl group, an anthoryl group, an azulenyl group, an acenaphthenyl group, a fluorenyl group, a phenantolyl group, an indenyl group, a pyrenyl group, and a biphenylyl group; an aromatic heterocyclic group such as a furyl group, a thienyl group, a pyridyl group, a pyridazyl group, a pyrimidyl group, a pyrazyl group, a triazyl group, an imidazolyl group, a pyrazolyl group, a thiazolyl group, a benzimidazolyl group, a benzoxazolyl group, a quinazolyl group, or a phthalazyl group; a heterocyclyl group such as a pyrrolidyl group, an imidazolydyl group, a morpholyl group, or an oxazolydyl group; an alkoxy group such as a methoxy group, an ethoxy group, a propyloxy group, a pentyloxy group, a hexyloxy group, an octyloxy group, or a dodecyloxy group; a cycloalkoxy group such as a cyclopentyloxy group or a cyclohexyloxy group; an aryloxy group such as a phenoxy group or a naphthyloxy group; an alkylthio group such as a methylthio group, an ethylthio group, a propylthio group, a pentylthio group, a hexylthio group, an octylthio group, or a dodecylthio group; a cycloalkylthio group such as a cyclopentylthio group or a cyclohexylthio group; an arylthio group such as a phenylthio group or a naphthylthio group; an alkoxycarbonyl group such as a methyloxycarbonyl group, an ethyloxycarbonyl group, a butyloxycarbonyl group, an octyloxycarbonyl group, or a dodecyloxycarbonyl group; an aryloxycarbonyl group such as a phenyloxycarbonyl group or a naphthyloxycarbonyl group; a sulfamoyl group such as an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, or a 2-pyridylaminosulfonyl group; an acyl group such as an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group; an acyloxy group such as an acetyloxy group, an ethylcarbonyloxy group, a butylcarbonyloxy group, an octylcarbonyloxy group, a dodecylcarbonyloxy group, or a phenylcarbonyloxy group; an amido group such as a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, or a naphthylcarbonylamino group; a carbamoyl group such as an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, or a 2-pyridylaminocarbonyl group; a ureido group such as a methylureido group, an ethylureido group, a pentylureido group, a cyclohexylureido group, an octylureido group, a dodecylureido group, a phenylureido group, a naphthylureido group, or a 2-pyridylaminoureido group; a sulfinyl group such as a methylsulfinyl group, an ethylsulfinyl group, a butylsulfinyl group, a cyclohexylsulfinyl group, a 2-ethylhexylsulfinyl group, a dodecylsulfinyl group, a phenylsulfonyl group, a naphthylsulfinyl group, or a 2-pyridylsulfinyl group; an alkylsulfonyl group such as a methylsulfonyl group, an ethylsulfonyl group, a butylsulfonyl group, a cyclohexylsulfonyl group, a 2-ethylhexylsulfonyl group, or a dodecylsulfonyl group; an arylsulfonyl group such as a phenylsulfonyl group, a naphthylsulfonyl group, or a 2-pyridylsulfonyl group; an amino group such as an amino group, an ethylamino group, a dimethylamino group, a butylamino group, a cyclopentylamino group, a 2-ethylhexylamino group, a dodecylamino group, an anilino group, a naphthylamino group, or a 2-pyridylamino group; an halogen atom such as a fluorine atom, a chlorine atom, or a bromine atom; a fluorinated hydrocarbon group such as a fluoromethyl group, a trifluoromethyl group, a pentafluoroethyl group or a pentafluorophenyl group; a cyano group; and a silyl group such as a trimethylsilyl group, a triisopropylsilyl group, a triphenylsilyl group, or a phenyldiethylsilyl group.

These substituents may further be substituted with any of the substituents described above, and a plurality of the substituents may join to form a ring.

Of these, a preferable substituent is an alkyl group, and a more preferable one is an alkyl group having 2-20 carbon atoms, but the most preferable one is an alkyl group having 6-12 carbon atoms.

(Terminal Group of Thiophene Oligomers)

The terminal group of thiophene oligomers utilized in the present invention will now be described.

It is preferable that the terminal group of the thiophene oligomers utilized in the present invention has no thienyl group. Preferable groups used as the terminal group include an aryl group such as a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, or a biphenylyl group, an alkyl group such as a methyl group, an ethyl group, a propyl group, an isopropyl group, a tert-butyl group, a pentyl group, a hexyl group, an octyl group, a dodecyl group, a tridecyl group, a tetradecyl group, or a pentadecyl group, and a halogen atom such as a fluorine atom, a chlorine atom, or a bromine atom.

(Steric Structure Characteristics of a Repeating Unit of the Thiophene Oligomer)

It is preferable that the thiophene oligomer used in the present invention has no Head-to-Head structure in its structure. Additionally, it is more preferable that a Head-to-Tail structure or a Tail-to-Tail structure is incorporated therein.

With regard to the Head-to-Head structure, the Head-to-Tail structure, and the Tail-to-Tail structure according to the present invention, referable documents include, for example, pages 27-32 of "π Denshi Kei Yuki Kotai (π-Electron Based Organic Solids)" (edited by the Chemical Society of Japan, published by Gakkai Shuppan Center, 1998) and Adv. Mater., 1998, 10, No. 2, pages 93-116. Each of the structural characteristics is specifically described below.

Herein, R is defined synonymously with R in Formula (1).

Head-to-Head Structure

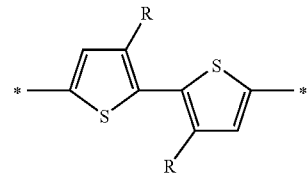

Head-to-Tail Structure

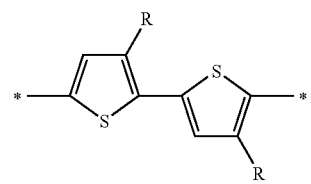

Tail-to-Tail Structure

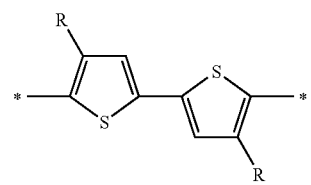

Specific examples of the thiophene oligomers utilized in the present invention are listed below, but the present invention is not limited thereto.

<1>

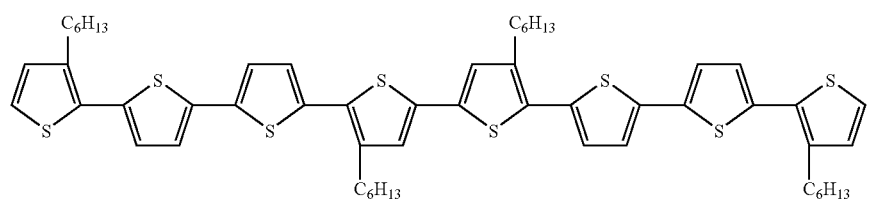

-continued
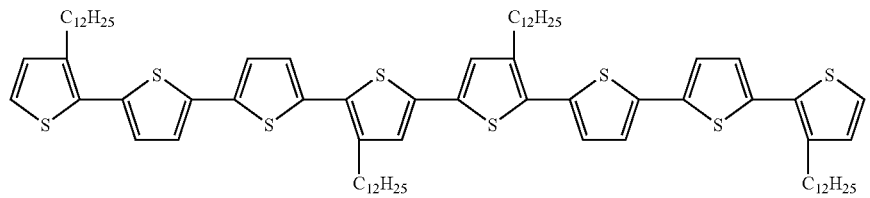
<2>
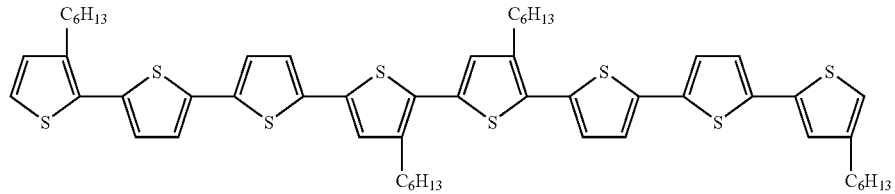
<3>
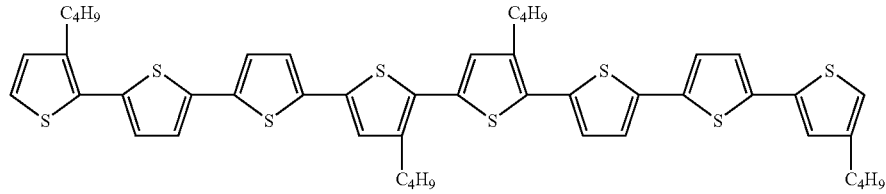
<4>
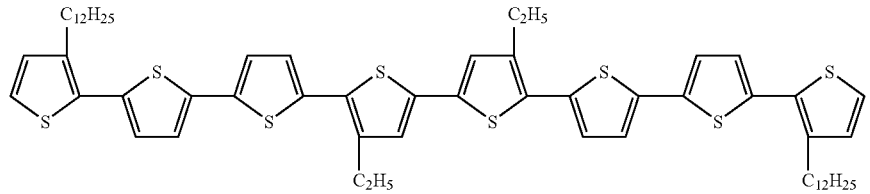
<5>
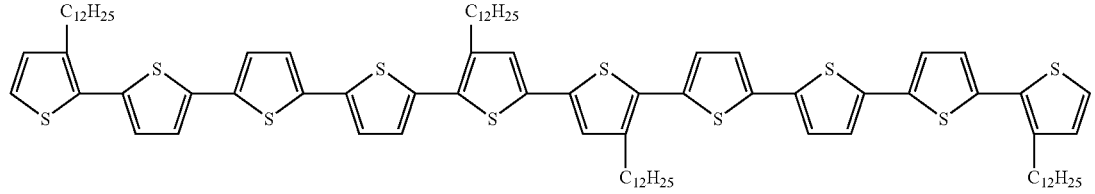
<6>
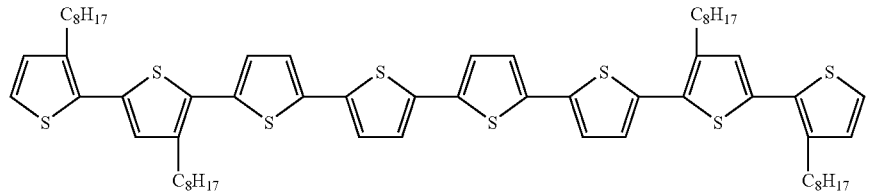
<7>
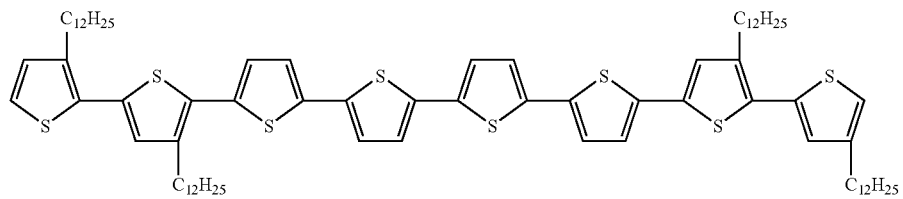
<8>

-continued
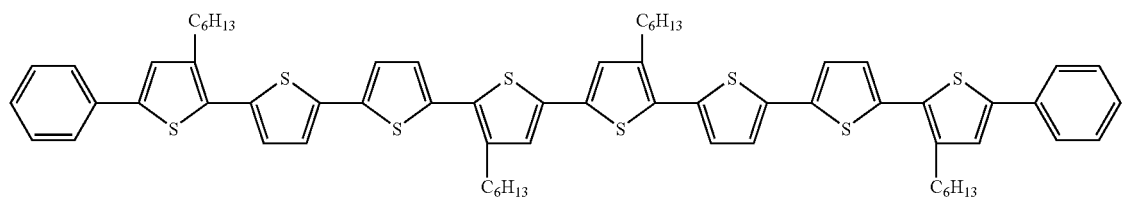
<9>
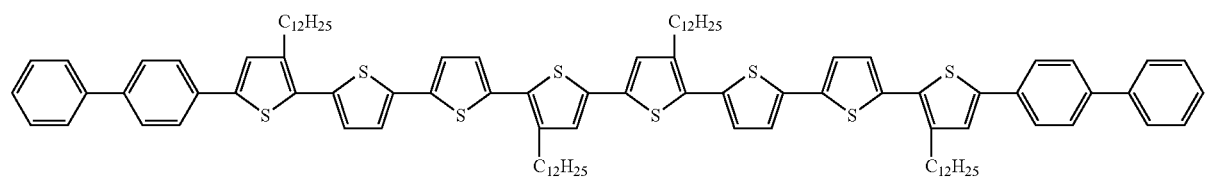
<10>
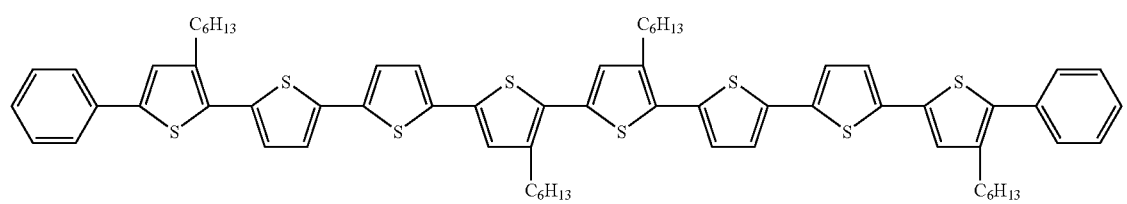
<11>
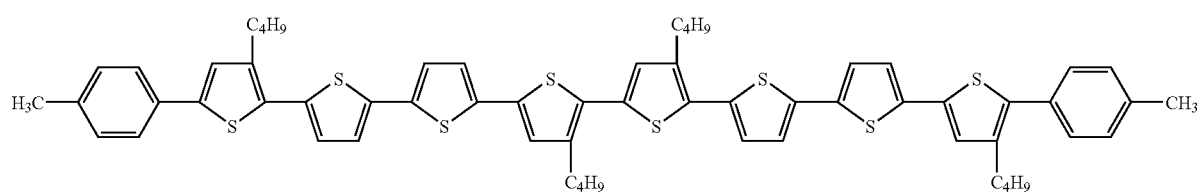
<12>
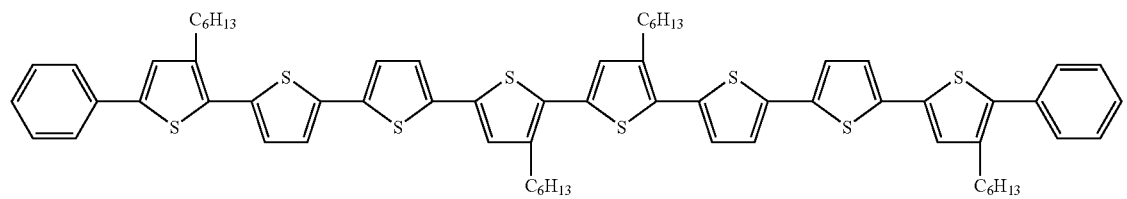
<13>
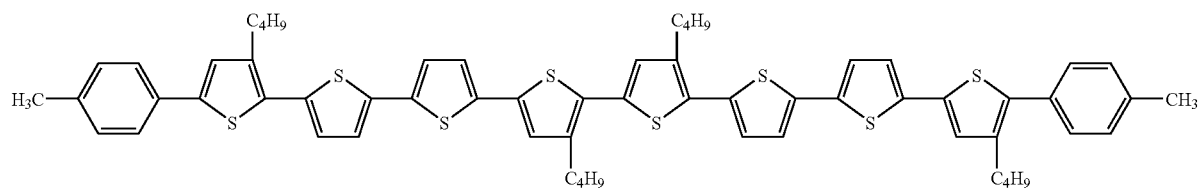
<14>
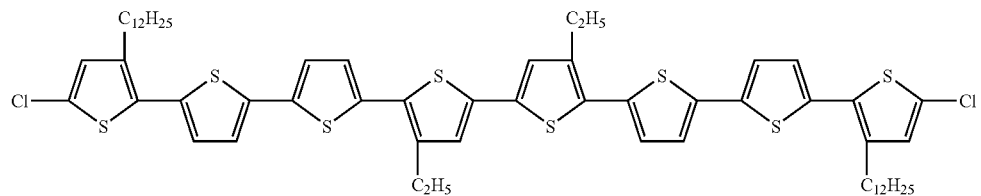
<15>

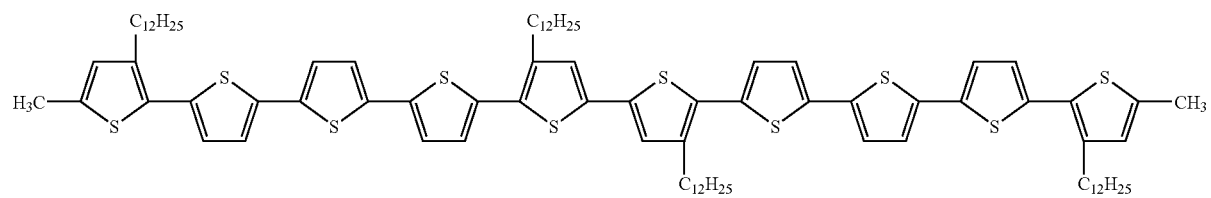
<16>
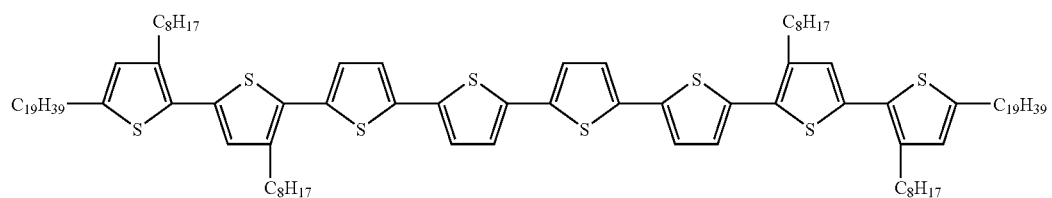
<17>
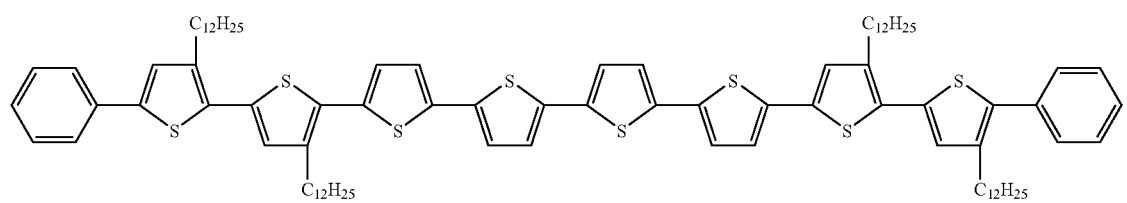
<18>
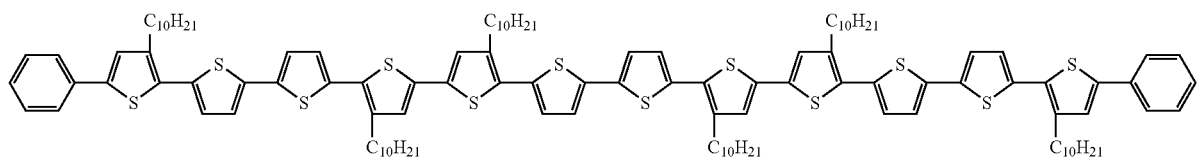
<19>
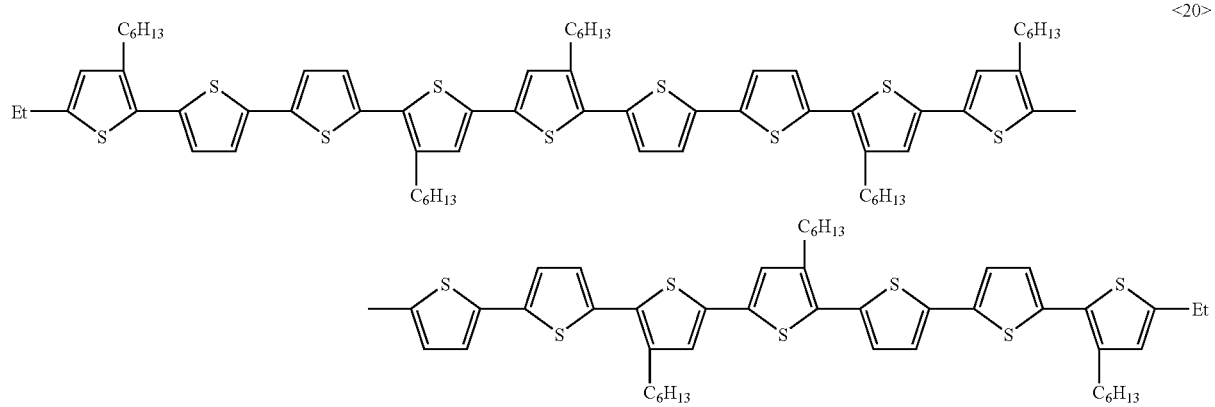
<20>
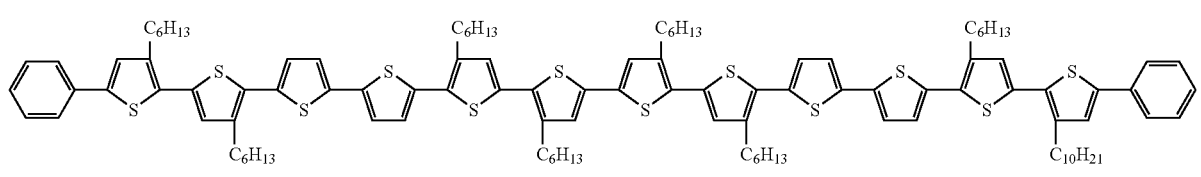
<21>
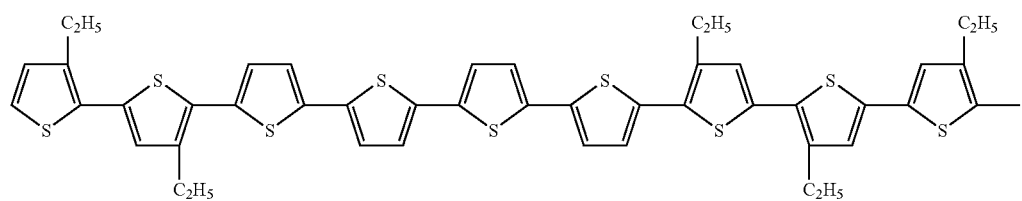
<22>

-continued

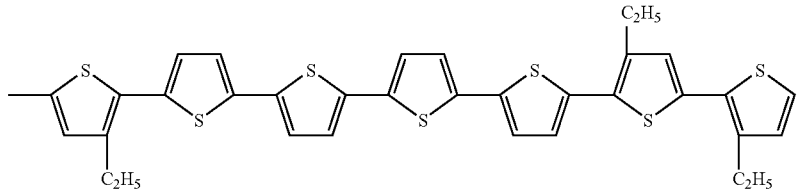

A production method of these thiophene oligomers is described in Japanese Patent Application Ser. No. 2004-172317 (applied on Jun. 10, 2004) via the inventor of the present invention and others.

Further, in the present invention, a so-called doping treatment may be carried out, wherein the organic semiconductor layer incorporates, for example, materials such as acrylic acid, acetamide or materials having a functional group such as a dimethylamino group, a cyano group, a carboxyl group, or a nitro group; materials such as benzoquinone derivatives, tetracyanoethylene and derivatives thereof, or tetracyanoquinodimethane and derivatives thereof which function as an acceptor accepting electrons; materials having a functional group such as an amino group, a triphenyl group, an alkyl group, a hydroxyl group, an alkoxy group, or a phenyl group; and materials, which serve as a donor donating electrons, including substituted amines such as phenylenediamine, anthracene, benzanthracene, substituted benzanthracenes, pyrene, substituted pyrene, carbazole and derivatives thereof, or tetrathiafulvalene and derivatives thereof.

The doping, described above, refers to the introduction of electron-accepting molecules (acceptors) or electron-donating molecules (donors) into the thin film as a dopant. Accordingly, a thin film having undergone doping is one that incorporates the condensed polycyclic aromatic compound and a dopant. As dopants for use in the present invention, those commonly known in the art may be utilized.

These organic semiconductor materials can be formed via methods known in the art, including, for example, vacuum deposition, MBE (Molecular Beam Epitaxy), an ion cluster beam method, a low-energy ion beam method, an ion plating method, a sputtering method, CVD (Chemical Vapor Deposition), laser deposition, electron beam deposition, electrodeposition, spin coating, dip coating, a bar coating method, a die coating method, a spray coating method, and the LB method, as well as coating methods such as screen printing, ink-jet printing, or blade coating.

Of these, in terms of productivity, preferable are the spin coating method, the blade coating method, the dip coating method, the roller coating method, the bar coating method, and the die coating method, all of which can simply and precisely form a thin film using an organic semiconductor solution.

Incidentally, with regard to those such as pentacene whose precursor is soluble in water, it is possible to form a thin film of the targeted organic semiconductor material via heat treatment of the precursor film formed via coating, as described in Advanced Material, 1999, No. 6, pages 480-483.

The film thickness of the organic semiconductor layer is not specifically limited. Properties of the obtained transistor tend to depend significantly on the film thickness of the organic semiconductor layer. The film thickness is commonly at most 1 μm, but is more preferably from 10-300 nm, depending on the organic semiconductor. Further, according to the organic semiconductor element of the present invention, at least one of the gate electrode and the source/drain electrodes is formed via a method for manufacturing the organic semiconductor element of the present invention, whereby a low resistance electrode can be formed with no property deterioration of the organic semiconductor material layer.

In the organic thin film transistor element of the present invention, a source electrode or a drain electrode is formed via the above electroless plating method. However, one of the source electrode and the drain electrode may be an electrode undergoing no electroless plating, as well as the gate electrode. The gate electrode and one of the source and the drain electrode are formed via common methods and electrode materials known in the art. The electrode materials are not specifically limited provided that the materials are electrically conductive. There are utilized platinum, gold, silver, nickel, chromium, copper, iron, tin, antimony lead, tantalum, indium, palladium, tellurium, rhenium, iridium, aluminum, ruthenium, germanium, molybdenum, tungsten, tin-antimony oxide, indium-tin oxide (ITO), fluorine-doped zinc oxide, zinc, carbon, graphite, glassy carbon, silver paste and carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. Alternatively, there may preferably be utilized conductive polymers known in the art with electric conductivity enhanced via doping such as conductive polyaniline, conductive polypyrrole, or conductive polythiophene (including a complex of polyethylene dixoythiophene and polystyrenesulfonic acid).

Of those cited above, as materials to form the source electrode or the drain electrode, preferable are ones that exhibit low electrical resistance in the contact plane with the semiconductor layer. With regard to p-type semiconductors, platinum, gold, silver, ITO, conductive polymers, and carbon are specifically preferable.

For the source electrode or the drain electrode formed, there are preferably employed those formed using fluidic electrode materials such as a solution, paste, ink, or dispersion incorporating the above conductive materials, specifically fluidic electrode materials incorporating conductive polymers or metal fine particles of platinum, gold, silver, or copper. Further, as solvents and dispersion media, in order to protect an organic semiconductor from damage, solvents or dispersion media are preferable which contain water in an amount of at least 60%, but preferably at least 90%.

For example, conductive pastes known in the art may be utilized as fluidic electrode materials containing metal fine particles, but preferable are materials prepared in such a manner that metal fine particles of a particle diameter of 1-50 nm, preferably 1-10 nm are dispersed in a dispersion medium such as water or any appropriate solvent, using a dispersion stabilizer, if necessary.

Usable materials for the metal fine particles include platinum, gold, silver, nickel, chromium, copper, iron, tin, antimony, lead, tantalum, indium, palladium, tellurium, rhenium, iridium, aluminum, ruthenium, germanium, molybdenum, tungsten, and zinc.

Production methods of these metal fine particle dispersions include physical production methods such as an in-gas evaporation method, a sputtering method, or a metal vapor synthesis method, and chemical production methods such as a colloid method or a coprecipitation method in which metal fine particles are prepared by reducing metal ions in the liquid phase. Preferable are dispersions of metal fine particles produced via methods such as the colloid methods described in JP-A Ser. Nos. 11-76800, 11-80647, 11-319538, and 2000-239853, and the in-gas evaporation methods described in JP-A Ser. Nos. 2001-254185, 2001-53028, 2001-35255, 2000-124157, and 2000-123634. An electrode is formed using any of these metal fine particle dispersions, then the solvent is removed by drying, and thereafter the electrode is heated in the temperature range of 100-300 ° C., preferably 150-200 ° C. in the shape thereof, as appropriate, whereby the metal fine particles undergo heat fusion and then an electrode pattern of the targeted shape is formed.

Methods of forming the electrode include one in which an electrode is formed in such a manner that a conductive thin film is prepared via a method such as deposition or sputtering using the above material as a raw material and then the photolithographic method and the lift-off method, known in the art, is applied to the resultant film, and another method in which a resist is formed on a metal foil such as aluminum or copper via heat transfer or ink-jet printing, followed by being etched. Further, patterning may be carried out via direct application of an ink-jet printing method using a conductive polymer solution or dispersion, or a dispersion containing metal fine particles, or the formation may be conducted from a coating using lithography or laser ablation. Still further, it is possible to utilize a method in which the patterning is carried out via printing methods such as letterpress, intaglio, lithographic, or screen printing, using a conductive ink or paste containing conductive polymers or metal fine particles.

The source electrode and the drain electrode are preferably formed specifically via the photolithographic method. In this case, a photoreactive resin solution is coated on the entire region contacting the organic semiconductor protective layer to form a photoreactive resin layer.

It is possible to utilize, for the photoreactive resin layer, resins similar to the above positive or negative photosensitive resins known in the art for use in patterning of a protective layer.

In the photolithographic method, subsequently, patterning is carried out using a metal fine particle-containing dispersion or a photoconductive polymer as a material for the source electrode and the drain electrode, and then heat fusion may be conducted, as appropriate, to give an electrode.

A solvent used to form a coating solution of the photosensitive resin layer as well as a method for forming the photoreactive resin layer are as described in the patterning of the protective layer.

In the step after formation of the photoreactive resin layer, a light source for use in pattern exposure and a developing solution to develop the photoreactive resin layer are also as described in the patterning of the protective layer. Further, in electrode formation, an ablation layer, which is another photoreactive resin layer, may be utilized. The ablation layer includes ones as described in the patterning of the protective layer.

It is possible to utilize various insulation films as a gate insulation layer of the organic thin film transistor element of the present invention. Of these, an inorganic oxide film featuring high dielectric constant is specifically preferable. The inorganic oxide includes silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth tantalate niobate, and yttrium trioxide. Of these, preferable are silicon oxide, aluminum oxide, tantalum oxide, and titanium oxide. It is also possible to preferably utilize inorganic nitrides such as silicon nitride or aluminum nitride.

Methods of forming the above film include dry processes such as a vacuum deposition method, a molecular beam epitaxy method, an ion cluster beam method, a low-energy ion beam method, an ion plating method, a CVD method, a sputtering method, or an atmospheric pressure plasma method, as well as wet processes such as methods employing coating such as a spray coating method, a spin coating method, a blade coating method, a dip coating method, a casting method, or a roller coating method, a bar coating method, or a die coating method, and methods employing patterning such as common printing or ink-jet printing. Any of these methods may be utilized depending on the materials used.

In the wet processes, there is utilized a method wherein a liquid prepared by dispersing inorganic oxide fine particles in any appropriate organic solvent or water, if necessary, using dispersing aids such as a surfactant, is coated and then dried, or a so-called sol-gel method wherein a solution of an oxide precursor such as an alkoxide is coated and then dried.

Of these described above, the atmospheric pressure plasma method is preferable.

The gate insulation film may preferably be composed of either an anodized film or the anodized film and an insulation film. The anodized film is preferably sealed. The anodized film is formed in such a manner that an anodizable metal is anodized via a method known in the art.

As the anodizable metal, aluminum or tantalum may be exemplified. Anodic treatment methods are not specifically limited, and any appropriate methods known in the art are usable. An oxidized film is formed via the anodic treatment. Any appropriate electrolytes may be utilized without any specific limitation, provided that a porous oxidized film can be form therewith. There are commonly utilized sulfuric acid, phosphoric acid, oxalic acid, chromic acid, boric acid, sulfamic acid, benzenesulfonic acid, or mixed acids containing at least two of the above acids or salts thereof. Anodic treatment conditions are not completely specified since they vary depending on the used electrolyte. Appropriate ranges are commonly as follows: the concentration of the electrolyte is from 1-80% by weight; the temperature thereof is from 5-70 ° C.; the current density is from 0.5-60 $A/dm^2$; the voltage is from 1-100 V; and the electrolysis duration is from 10 seconds-5 minutes. A preferable anodic treatment employs a method in which an aqueous solution of sulfuric acid, phosphoric acid, or boric acid is used as the electrolyte and the treatment is carried out using direct current, but alternating current may also be employed. The concentrations of these acids are preferably from 5-45% by weight, and it is preferable to carry out electrolysis at an electrolyte temperature of 20-50 ° C. at a current density of 0.5-20 $A/dm^2$ for 20-250 seconds.

Further, for the organic compound film, there may be utilized polyimide, polyamide, polyester, polyacrylate, photo-radical polymerization based or photo-cationic polymerization based photocurable resins, copolymers incorporating acrylonitrile compositions, polyvinyl phenol, polyvinyl alcohol, novolac resins, and cyanoethyl pullulan.

The above wet process is a preferable method to form the organic compound film.

An inorganic oxide film and an organic oxide film may be simultaneously used via lamination. Further, the film thicknesses of these insulation films are commonly from 50 nm-3 μm, but are preferably from 100 nm-1 μm.

When an organic semiconductor is formed on the gate insulation layer, any appropriate surface treatment may be conducted on the gate insulation layer. A self-organizing orientation film composed of a silane-coupling agent such as octadecyltrichlorosilane or trichloromethylsilazane, alkane phosphoric acid, alkane sulfonic acid, or alkane carboxylic acid is suitably utilized.

(Substrate)

Various materials may be utilized as a support material constituting the substrate, including, for example, ceramic substrates such as glass, quartz, aluminum oxide, sapphire, silicon nitride, or silicon carbide, and semiconductor substrates such as silicon, germanium, gallium arsenide, gallium phosphide, or gallium nitrogen, as well as paper and unwoven cloth. However, in the present invention, the substrate is preferably composed of a resin. For example, a plastic sheet film is usable. Such a plastic sheet film includes films incorporating, for example, polyethylene terephthalate (PET), polyethylene naphthalate (PEN), polyether sulfone (PES), polyether imide, polyether ether ketone, polyphenylene sulfide, polyacrylate, polyimide, polycarbonate (PC), cellulose triacetate (TAC), or cellulose acetate propionate (CAP). Using the plastic film makes it possible to reduce weight compared to cases in which a glass substrate is utilized, then resulting in enhanced portability and impact resistance.

Further, it is possible to arrange an element protective layer on the organic thin film transistor element of the present invention. As the protective layer, the inorganic oxides or inorganic nitrides described above are exemplified. The protective layer is preferably formed using the atmospheric pressure plasma method, whereby the durability of the organic thin film transistor element is enhanced.

In the organic thin film transistor element of the present invention, when a plastic film is used as the support, it is preferable to incorporate at least one of a sublayer containing a compound selected from inorganic oxides and inorganic nitrides and a sublayer containing a polymer.

The inorganic oxides contained in the sublayer include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth tantalate niobate, and yttrium trioxide. The inorganic nitrides include silicon nitride or aluminum nitride.

Of these, preferable are silicon oxide, aluminum oxide, tantalum oxide, titanium oxide, and silicon nitride.

In the present invention, the sublayer containing a compound selected from inorganic oxides and inorganic nitrides is preferably formed via the atmospheric pressure plasma method.

As the polymers used for the sublayer containing a polymer, there may be exemplified polyester resins, polycarbonate resins, cellulose resins, acrylic resins, polyurethane resins, polyethylene resins, polypropylene resins, polystyrene resins, phenoxy resins, norbornene resins, epoxy resins, vinyl based polymers such as vinyl chloride-vinyl acetate copolymers, vinyl chloride resins, vinyl acetate resins, vinyl acetate-vinyl alcohol copolymers, partially-hydrolyzed vinyl chloride-vinyl acetate copolymers, vinyl chloride-vinylidene chloride copolymers, vinyl chloride-acrylonitrile copolymers, ethylene-vinyl alcohol copolymers, polyvinyl alcohol, chlorinated polyvinyl chloride, ethylene-vinyl chloride copolymers, or ethylene-vinyl acetate copolymers, polyamide resins, rubber based resins such as ethylene-butadiene resins or butadiene-acrylonitrile resins, silicone resins, and fluorine based resins.

Preferred embodiments of a structure of the organic thin film transistor element of the present invention and a manufacturing method thereof will now be detailed.

FIG. 1 is a view showing one structural example of the organic thin film transistor element of the present invention. FIG. 1(a) is a view showing an example, wherein a source electrode 52 and a drain electrode 53 are formed on a support 56 using metallic foil; an organic semiconductor layer 51 composed of the organic semiconductor material of the present invention is formed between the electrodes and then an insulation layer 55 is formed thereon; and further a gate electrode 54 is formed thereon to form an organic thin film transistor element. FIG. 1(b) is a view showing another example, wherein the organic semiconductor layer 51 is formed so as to cover the entire surface of the electrodes and the support via a coating method although the organic semiconductor layer 51 is formed between the electrodes in the above (a). FIG. 1(c) is a view still yet showing another example, wherein initially, the organic semiconductor layer 51 is formed on the support 56 using a coating method, and then the source electrode 52, the drain electrode 53, the insulation layer 55, and the gate electrode 54 are formed.

Figure 2:
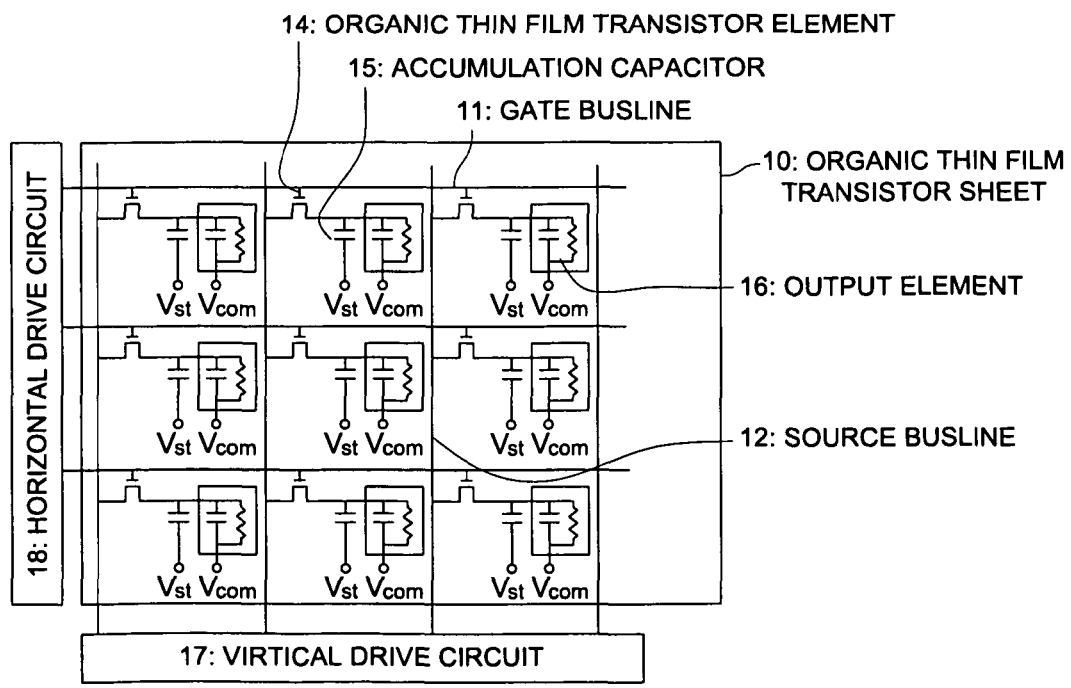
FIG. 2 is a schematic view showing an equivalent circuit of one example of an organic thin film transistor element sheet.

FIG. 2 is a schematic view showing an equivalent circuit of one example of an organic thin film transistor element sheet 10, wherein a plurality of the organic thin film transistor elements of the present invention are arranged.

The organic thin film transistor sheet 10 incorporates a number of organic thin film transistor elements 14 matrix-arranged. The symbol 11 represents a gate busline for the gate electrode of each organic thin film transistor element 14, and the symbol 12 represents a source busline for the source electrode of each organic thin film transistor element 14. The drain electrode of each organic thin film transistor element 14 is connected with an output element 16, being, for example, a liquid crystal or an electrophoretic element, which constitutes a pixel of a display device. In the illustrated example, an equivalent circuit constituted of a resistor and a capacitor shows a liquid crystal used as the output element 16. The symbols 15, 17, and 18 represent an accumulation capacitor, a vertical drive circuit, and a horizontal drive circuit, respectively.

Enhanced adhesion between a support and a TFT constituent layer in a sheet formed via two-dimensional arrangement of organic TFT elements on a flexible resin support makes it possible that the sheet exhibits excellent mechanical strength and strong resistance against flexure of the support.

Figure 3:
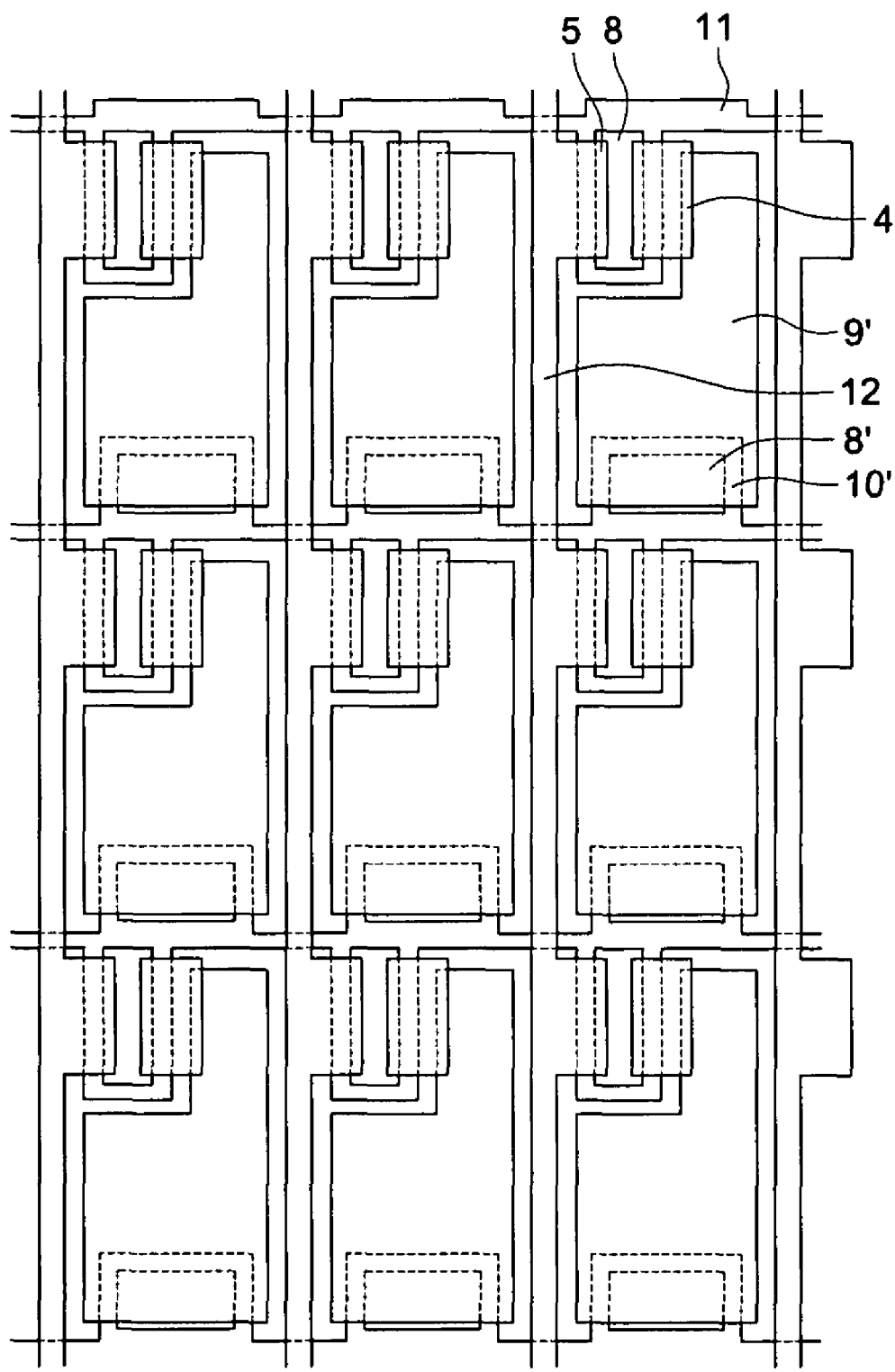
FIG. 3 is a view showing a resin substrate on which a gate electrode, a gate insulation layer, an organic semiconductor layer, and a protective layer pattern are arranged.

FIG. 3 is an arrangement example of an actual TFT element sheet according to the equivalent circuit. The organic thin film transistor sheet (TFT) is of an additional capacitor type, which initially incorporates a gate electrode 2 on a support 1 and thereon a source electrode 6 and a drain electrode 5 connected with a channel, being composed of a semiconductor layer, via a gate insulation layer 3, whereby the electrodes are connected each via a gate busline 12 and a source busline 13 on the sheet support. The symbols 9' and 10' represent an output electrode and an additional capacitor, respectively. Herein, the semiconductor layer is formed via entire coating.

Further, an electrode 8' is formed on the additional capacitor portion of the symbol 10 in the same manner as for the gate electrode.

Further, a method for manufacturing a thin film transistor via the method of the present invention will now be described with reference to FIG. 4.

FIG. 4(1) shows a resin substrate wherein a gate electrode, a gate insulation layer, an organic semiconductor layer and further a protective layer pattern are arranged. In the view, the gate electrode 8 is arranged on the resin substrate 1 provided with a sublayer 2, serving also as an insulation layer; an anodized layer 9 is arranged on the electrode to realize high-dielectric constant; and further thereon, the gate insulation layer 7 (for example, a silicon oxidize layer) is arranged, followed by arrangement of the semiconductor layer 6 and the patterned protective layer 3 thereon.

Patterning of a protective layer may be carried out via an ink-jet method or a common printing method, but a preferable method is one, wherein a coated photosensitive resin layer is subjected to pattern exposure to form a resist, followed by being selectively washed to leave a protective layer. For example, after formation of an ablation layer, ablation is carried out via laser (LD) exposure, followed by removal of the protective layer via development.

When the resist forming process, the photosensitive layer formation, the exposure, or the development has no adverse effect on the organic semiconductor layer, a photosensitive resin layer and a resist formed therefrom may also directly be utilized as the protective layer.

Further, an electroless plating catalyst liquid is ejected via an ink-jet (being a piezo-type) method for patterning of the plating catalyst liquid to form a plating catalyst layer M1 (FIGS. 4(2) and 4(3)).

Since the portion to form a channel of the organic semiconductor material layer is coated with the protective layer, the catalyst liquid tends not to deteriorate this portion.

Subsequently, this resin substrate film is immersed in a plating bath to form a metal thin film M2 on the plating catalyst portion, resulting in a source and a drain electrode (FIG. 4(4)).

In this way, according to the method for manufacturing the organic semiconductor element of the present invention, the protection of the region other than the electrode-forming region employing the organic semiconductor protective layer makes it possible to form a high-performance TFT sheet (organic thin film transistor sheet) featuring a low resistance electrode formed via an electroless plating method and no deteriorated organic semiconductor layer. In the organic thin film transistor element, a great effect can be produced in protecting, specifically, the region of the organic semiconductor layer constituting the channel from occurrence of its property variations.

More specific embodiments of the manufacture of a TFT sheet (namely an organic thin film transistor sheet) using the method for manufacturing the thin film transistor of the present invention will now be described with reference to FIGS. 5-8, but the scope of the present invention is not limited thereto. Herein, in these views, no electrode, formed in the additional capacitor portion of the above TFT sheet, is shown.

(Formation of a Gate Busline and a Gate Electrode)

FIG. 5(1) shows a manner in that a gate busline and a gate electrode are prepared on a substrate. The gate busline and the gate electrode were prepared as follows. A PES (polyether sulfone) resin film was used as the substrate.

Namely, first of all, corona discharge treatment was carried out on the PES resin film under a condition of 50 W/m²/min. Then, a sublayer was formed to enhance adhesion as follows.

(Formation of a Sublayer)

A coating liquid of the following composition was coated at a dry film thickness of 2 μm and the resultant layer was dried at 90° C. for 5 minutes, followed by being cured using a high pressure mercury lamp of 60 W/cm for 4 seconds at a 10 cm distance from the lamp.

| | |
|---|---|
| Dipentaerythritolhexaacrylate monomer | 60 g |
| Dipentaerythritolhexaacrylate dimmer | 20 g |
| Composition of at least a trimer of dipentaerythritolhexaacrylate | 20 g |
| Diethoxybenzophenone UV initiator | 2 g |
| Silicone surfactant | 1 g |
| Methyl ethyl ketone | 75 g |
| Methylpropylene glycol | 75 g |

Further, atmospheric pressure plasma treatment was carried out on the layer under the following conditions to form a silicon oxide layer of a 50 nm thickness, designated as a sublayer 2.

(Gases Used)

| | |
|---|---|
| Inert gas: helium | 98.25% by volume |
| Reactive gas: oxygen gas | 1.5% by volume |
| Reactive gas: tetraetoxysilane vapor (bubbled with helium gas) | 0.25% by volume |

(Discharge Conditions)

| | |
|---|---|
| Discharge power: | 10 W/cm² |

(Electrode Conditions)

The electrode was a grounded roll electrode having a dielectric material (dielectric constant: 10) with a smoothed surface at a 5 μm Rmax, wherein a stainless steel jacket roll base material having a cooling device via chilled water was coated with a 1 mm thickness of alumina via ceramic spraying, followed by being coated with a solution prepared by diluting tetraetoxysilane with ethyl acetate and dried, and then by being sealed via ultraviolet irradiation. In contrast, to prepare an application electrode, a hollow square-shape stainless pipe was coated with the above dielectric material under the identical conditions.

(Gate Electrode Forming Process)

Subsequently, a gate electrode was formed.

A photosensitive resin composition liquid 1 was coated on the sublayer 2, followed by being dried at 100° C. for 1 minute to form a photosensitive resin layer of a 2 μm thickness.

(Photosensitive Resin Composition Liquid 1)

| | |
|---|---|
| Dye A | 7 parts |
| Novolac resin (novolac resin prepared by co-condensating phenol and a mixture of m-cresol and p-cresol, as wall as formaldehyde (Mw = 4000; a mole ratio of phenol/m-cresol/p-cresol is 5/57/38)) | 90 parts |

-continued

| | |
|---|---|
| Crystal violet | 3 parts |
| Propylene glycol monomethyl ether | 1000 parts |

Dye A

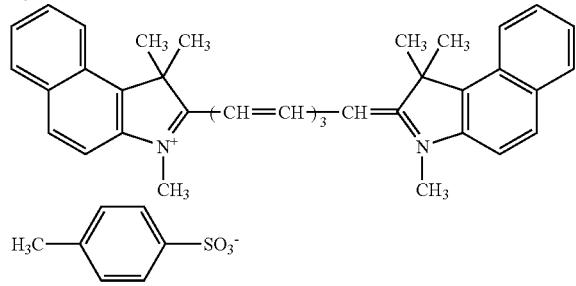

A pattern of a gate line and a gate electrode was exposed using a 100 mW semiconductor laser of an 830 nm oscillation wavelength at an energy density of 200 mJ/cm$^2$, followed by being developed with an alkaline aqueous solution to give a resist image.

Further, a 300 nm-thickness aluminum film was coated entirely thereon via a sputtering method, followed by removing the residual portion of the photosensitive resin layer with MEK to prepare the gate busline and the gate electrode 8.

Subsequently, onto the gate electrode, an anodized film was formed as an auxiliary insulation layer for smoothing and insulation enhancing.

(Anodized Film Forming Process)

The film substrate was washed well, and then an anodized film 9 featuring a 120 nm anodized film thickness was prepared in a sulfuric acid aqueous solution of 30% by weight via direct current supplied from a low voltage power source of 30 V for 2 minutes. After washed well, the resultant film was vapor-sealed in a saturated vapor chamber at 100° C. at normal pressure. In this way, a gate electrode having the anodized film was prepared on a sublayered polyethersulfone resin film (FIG. 5(1)).

(Gate Insulation Layer Forming Process)

Then, a silicon oxide layer of a 30 nm thickness was further formed at a 200° C. film temperature via the atmospheric pressure plasma method, followed being combined with the anodized aluminum layer to form the gate insulation layer 7 of a 150 nm thickness (FIG. 5(2)).

(Organic Semiconductor Layer Forming Process)

Subsequently, an organic semiconductor layer was formed on the gate insulation layer. Namely, a prepared cyclohexane solution of the thiophene oligomer (2) (0.5% by weight) was ejected on the region where a channel is formed via a piezo-type ink-jet method, followed by being dried at 50° C. for 3 minutes in nitrogen gas to form the organic semiconductor layer 6 on the substrate (FIG. 5(3)). Herein, the film thickness of the semiconductor layer was 20 nm.

(Organic Semiconductor Protective Layer Forming Process)

Onto the organic semiconductor layer 6, coated was an aqueous solution prepared by dissolving well-purified polyvinyl alcohol in water purified using an ultra-pure water production apparatus, followed by being dried well under an ambience of nitrogen gas at 100° C. to form the organic semiconductor protective layer 3 made of polyvinyl alcohol of a 1 μm thickness (FIG. 6(1)).

(Photosensitive Layer Forming Process)

A composition 1, described below, was kneaded and dispersed, followed by adding 5.90 parts of a polyisocyanate compound (CORONATE 3041, active ingredient: 50%, produced by Nippon Polyurethane Industry Co., Ltd.) and then by stirring using a dissolver to prepare a coating liquid 1.

Composition 1

| | |
|---|---|
| Fe—Al based ferromagnetic metal powder (Fe:Al atomic number ratio = 100:4, average long-axis diameter: 0.14 μm) | 100 parts |
| Vinyl chloride based resin (MR-110, produced by Zeon Corp.) | 10.0 parts |
| Polyurethane resin (VYLON UR-8200, produced by Toyobo Co., LTD.) | 5.0 parts |
| Phosphate (PHOSPHANOL RE610, produced by Toho Chemical Industry Co., Ltd.) | 3.0 parts |
| Methyl ethyl ketone | 105.0 parts |
| Toluene | 105.0 parts |
| Cyclohexane | 90.0 parts |

The composition 1 was coated on the protective layer 3, followed by being treated at 100° C. for 5 minutes to form a photosensitive layer 3' of a 0.3 μm thickness.

Further, onto the photosensitive layer, coated was a liquid prepared by diluting a composition 2, described below, with a single solvent of "ISOPAR E" (isoparaffinic hydrocarbon, produced by Exxon Mobile Corp.) to a solid concentration of 10.3% by weight to form an electrode material repulsion layer 3' of a 0.4 μm thickness silicone rubber layer (FIG. 6(2)).

Composition 2

| | |
|---|---|
| α,ω-divinylpolydimethylcyclohexane (molecular weight: about 60,000) | 100 parts |
| HMS-501 (copolymer of (methylhydrogensiloxane) (dimethylsiloxane) with methyl groups at both the ends, SiH group number/molecular weight = 0.69 mol/g, produced by Chisso Corp.) | 7 parts |
| Vinyltris(methylethylketoxyimino)silane | 3 parts |
| SRX-212 (platinum catalyst, produced by Dow Corning Toray Co., Ltd.) | 5 parts |

(Photosensitive Layer Exposure Process, Development Process, and Organic Semiconductor Protective Layer Removal Process)

Adhesion between the photosensitive layer 3' and the electrode material repulsion layer 3' was varied via exposure of an electrode pattern using a 100 mW semiconductor laser of an 830 nm oscillation wavelength at an energy density of 200 mJ/cm$^2$, and then the silicone rubber layer in the exposed portion was removed via brush treatment.

Subsequently, the photosensitive layer in the exposed portion and the organic semiconductor protective layer of polyvinyl alcohol were removed by well washing (FIG. 7(1)).

(Electrode Forming Process)

(Plating Catalyst Pattern Formation)

Further, when a catalyst liquid was coated on the entire surface containing the silicone rubber layer, the catalyst liquid was repelled in the region having the remaining silicone layer, being the protective layer, and then supplied to the region where the protective layer had been removed, whereby a plating catalyst pattern M1 was formed according to the pattern of the source and the drain electrode (FIG. 7(2)).

As the catalyst liquid, used was a hydrochloric acid solution of palladium chloride (being a solution containing palladium chloride 1% by weight, hydrochloric acid 10% by weight, isopropyl alcohol 20% by weight, and polyvinyl alcohol 1% by weight).

(Plating Agent Supply)

Figure 8:
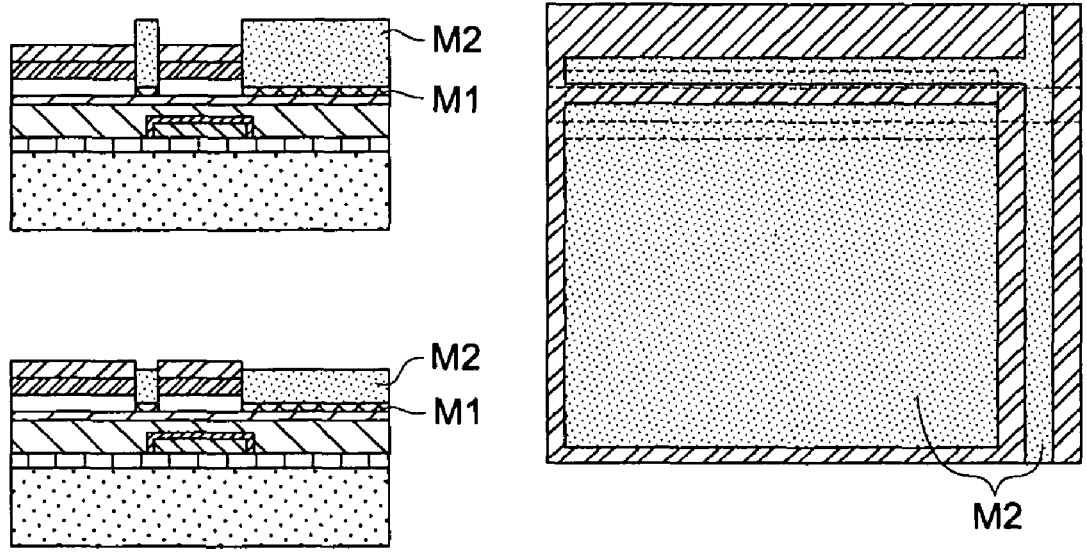
FIG. 8 is a view showing a manufacturing example of a TFT sheet employing a method for manufacturing the thin film transistor of the present invention.

Then, the substrate having the thus formed catalyst pattern was immersed in an electroless gold plating bath (being a homogeneous solution prepared by dissolving 0.1 mol/l of potassium dicyanogold, 0.1 mol/l of sodium oxalate, and 0.1 mol/l of sodium potassium tartrate) to form a source electrode and a drain electrode with a metal thin film M2 composed of gold of a 110 nm thickness. After the electrodes were formed, a thin film transistor was formed via well washing and drying (FIG. 8).

An example of the manufacture of the TFT sheet via the method for manufacturing the organic semiconductor element was described above. In this way, according to the present invention, when the region other than the electrode-forming region in an organic semiconductor layer is protected with an organic semiconductor protective layer, the deterioration of the organic semiconductor layer, undergoing electroless plating, can be prevented, whereby a high-performance organic thin film transistor (sheet) featuring a low resistance electrode can be formed. The organic semiconductor protective layer makes it possible to produce a great effect in that property variations of the organic semiconductor layer where no electrode is formed can be prevented.

The invention claimed is:

1. A method of manufacturing a thin film transistor comprising the steps of:
    forming a protective layer on an organic semiconductor layer;
    forming a plating catalyst pattern by supplying a liquid which contains a plating catalyst; and
    bringing into contact a plating agent with the plating catalyst pattern so as to form a source electrode or a drain electrode;
    wherein the plating catalyst pattern is formed by supplying the liquid which contains a plating catalyst on a region in contact with the protective layer.

2. A method of manufacturing a thin film transistor comprising the steps of:
    forming a protective layer on an organic semiconductor layer;
    forming a plating catalyst pattern by supplying a liquid which contains a plating catalyst; and
    bringing into contact a plating agent with the plating catalyst pattern so as to form a source electrode or a drain electrode;
    wherein a region repulsive to the liquid which contains a plating catalyst is provided on the protective layer or on a region in contact with the protective layer.

* * * * *